(12) United States Patent
Miyoshi

(10) Patent No.: US 7,581,295 B2
(45) Date of Patent: Sep. 1, 2009

(54) PIEZOELECTRIC ELEMENT AND METHOD OF MANUFACTURING THE SAME

(75) Inventor: Tetsu Miyoshi, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/564,146

(22) Filed: Nov. 28, 2006

(65) Prior Publication Data
US 2007/0094856 A1 May 3, 2007

Related U.S. Application Data

(62) Division of application No. 11/058,282, filed on Feb. 16, 2005, now abandoned.

(30) Foreign Application Priority Data

Feb. 18, 2004 (JP) .............................. 2004-040829

(51) Int. Cl.
*H01L 41/22* (2006.01)
*H05K 3/20* (2006.01)
*H01L 41/00* (2006.01)
*B05D 5/12* (2006.01)
*B05D 1/32* (2006.01)

(52) U.S. Cl. .................. 29/25.35; 29/25.42; 29/831; 310/328; 310/358; 427/100; 427/282

(58) Field of Classification Search .............. 29/25.35, 29/25.42, 831; 310/328, 358, 311; 427/100, 427/282
See application file for complete search history.

(56) References Cited

U.S. PATENT DOCUMENTS

| | | | | |
|---|---|---|---|---|
| 4,994,703 | A * | 2/1991 | Oguri et al. ................. | 310/363 |
| 5,144,528 | A * | 9/1992 | Watanabe et al. ......... | 361/321.1 |
| 6,255,121 | B1 * | 7/2001 | Arita et al. ..................... | 438/3 |
| 6,469,421 | B1 * | 10/2002 | Wakabayashi et al. ...... | 310/328 |
| 6,577,044 | B1 | 6/2003 | Li | |
| 6,692,646 | B2 * | 2/2004 | Kalt et al. ..................... | 216/24 |
| 6,771,410 | B1 * | 8/2004 | Bourlanoff et al. .......... | 359/248 |
| 6,930,340 | B2 * | 8/2005 | Hasegawa et al. ........... | 257/295 |
| 7,054,135 | B2 | 5/2006 | Kuniyasa | |
| 7,087,970 | B2 | 8/2006 | Nakamura | |
| 7,240,996 | B2 * | 7/2007 | Kobayashi et al. ............ | 347/68 |
| 7,286,354 | B2 * | 10/2007 | Sugahara .................... | 361/699 |

(Continued)

FOREIGN PATENT DOCUMENTS

JP        60-128683 A        7/1985

Primary Examiner—A. Dexter Tugbang
Assistant Examiner—David P Angwin
(74) Attorney, Agent, or Firm—Sughrue Mion, PLLC

(57) ABSTRACT

An array of piezoelectric elements is easily manufactured by making insulating portions at side surfaces smaller. The piezoelectric element includes: a multilayered structure in which piezoelectric material layers and internal electrode layers are alternately stacked; first insulating films formed by using an AD method, for covering a first group of internal electrode layers at a first surface of the multilayered structure; second insulating films formed by using the AD method, for covering a second group of internal electrode layers at a second surface of the multilayered structure; a first external electrode connected to the second group of internal electrode layers and insulated from the first group of internal electrode layers at the first surface; and a second external electrode connected to the first group of internal electrode layers and insulated from the second group of internal electrode layers at the second surface.

5 Claims, 9 Drawing Sheets

U.S. PATENT DOCUMENTS

| | | | |
|---|---|---|---|
| 7,352,591 B2 * | 4/2008 | Sugahara | 361/760 |
| 2002/0036059 A1 * | 3/2002 | Kalt et al. | 156/267 |
| 2003/0186536 A1 * | 10/2003 | Brenner | 438/637 |
| 2003/0230629 A1 * | 12/2003 | Bourianoff et al. | 235/454 |
| 2004/0016120 A1 * | 1/2004 | Boland et al. | 29/886 |
| 2005/0095361 A1 * | 5/2005 | Takamatsu et al. | 427/240 |
| 2005/0212867 A1 * | 9/2005 | Nagashima | 347/71 |

\* cited by examiner

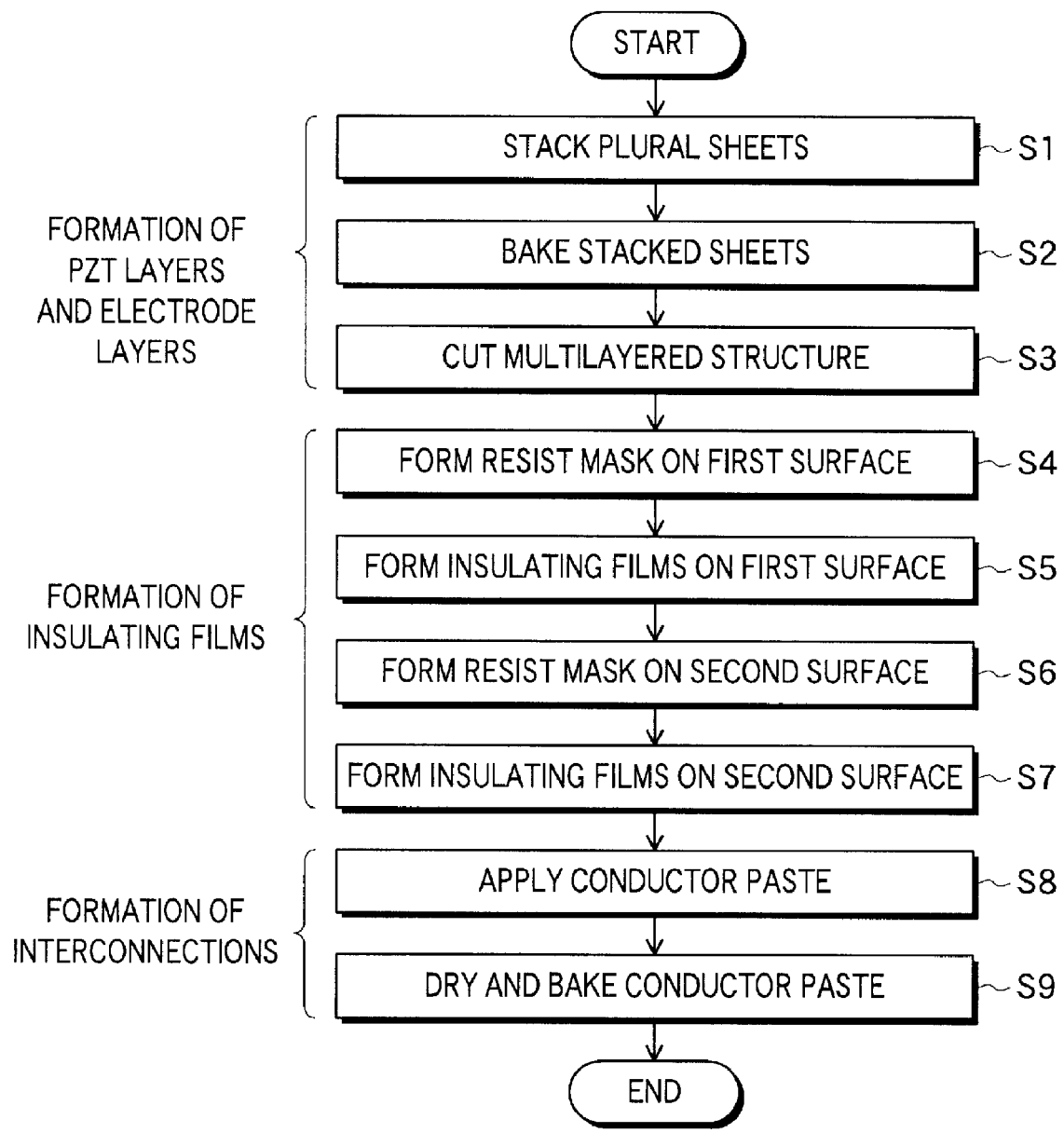

PIEZOELECTRIC ELEMENT AND METHOD OF MANUFACTURING THE SAME

CROSS REFERENCE TO RELATED APPLICATIONS

This application is a Divisional Application of U.S. application Ser. No. 11/058,282 filed Feb. 16, 2005; the entire disclosure of which is incorporated herein by reference.

BACKGROUND OF THE INVENTION

1. Field of the Invention

The present invention relates to a piezoelectric element in which piezoelectric material layers and electrode layers are alternately formed, and the present invention further relates to a method of manufacturing the piezoelectric element.

2. Description of a Related Art

Multilayered structures in each of which insulating (dielectric) layers and electrode layers are alternately formed are utilized for various uses such as multilayered capacitors, piezoelectric pumps, piezoelectric actuators and ultrasonic transducers. In recent years, with the developments of MEMS (micro electro-mechanical systems) related devices, elements each having such a multilayered structure have been microfabricated still further and packaged more densely.

In microfabrication of an element having opposed electrodes, the smaller the area of the element is made, the smaller the capacity between the electrodes becomes, and therefore, a problem occurs that the electrical impedance of the element rises. For example, when the electrical impedance rises in a piezoelectric actuator, the impedance matching can not be taken with a signal circuit for driving the piezoelectric actuator and power becomes difficult to be supplied, and thereby, the performance as the piezoelectric actuator is degraded. Alternatively, in an ultrasonic transducer using a piezoelectric element, detection sensitivity of ultrasonic wave is dropped. Accordingly, in order to enlarge the capacity between electrodes while microfabricating the element, plural piezoelectric material layers and plural electrode layers are alternatively stacked. That is, the capacity between electrodes of the entire element can be made larger by connecting the stacked plural layers in parallel.

As a method of manufacturing a piezoelectric element having a multilayered structure, conventionally, a bulk method employing bulk piezoelectric materials has been known. In the bulk method, a technique of alternately stacking the bulk piezoelectric materials that have been cut in desired thicknesses and electrode layers, and securing them with an adhesive or bolts is used. However, this technique is generally used for manufacturing a relatively large piezoelectric element and not suitable for manufacturing a minute piezoelectric element for the following reason. That is, because piezoelectric materials that have been cut into thin pieces are brittle and easy to break, and the handling of them is difficult. Especially, the piezoelectric material having a thickness of 100 μm or less is easy to break. Further, because the microfabrication is difficult by the technique, the manufacturing process becomes complicated. Furthermore, with respect to finished products, there is a problem about attachment performance due to the adhesive, and a problem occurs that stress is produced in the bonded part. Accordingly, the manufacturing yield is reduced and the cost of manufacturing is increased by the technique, and therefore, the method is not suitable in view of productivity.

Then, manufacturing the piezoelectric element by using a film forming technology such as a green sheet method has been under study.

In the green sheet method, a green sheet (piezoelectric material sheet) is used, which is formed by a mixture of a powder of a piezoelectric material having no plasticity with a binder of an organic material or the like. In this technique, plural piezoelectric material sheets, onto which paste of an electrode material is applied by screen printing or the like, are stacked and baked at high temperature of about 1000° C. so as to allow the binder to fly from the piezoelectric material sheets, and thereby, the piezoelectric materials are made into strong films.

In a piezoelectric element manufactured using such a technique, in order to connect the plural internal electrode layers to each other, interconnection is performed on the side surfaces of the piezoelectric element. FIG. 9 is a sectional view for explanation of a general interconnecting method of a piezoelectric element having a multilayered structure. The piezoelectric element 100 includes plural piezoelectric material layers 101, plural internal electrode layers 102 and 103, and side electrodes 104 and 105.

The internal electrode layers 102 are formed so that one ends thereof extend to one wall surface of the piezoelectric element, and internal electrode layers 103 are formed so that one ends thereof extend to the other wall surface of the piezoelectric element. Thereby, the internal electrode layers 102 are connected to the side electrode 104 and insulated from the side electrode 105 by insulating regions 106. Contrary, the internal electrode layers 103 are connected to the side electrode 105 and insulated from the side electrode 104 by insulating regions 106. By applying a potential difference between the side electrode 104 and the side electrode 105, a voltage is applied between the internal electrode layers 102 and the internal electrode layers 103, and each piezoelectric material layers 101 disposed therebetween expands and contracts by the piezoelectric effect.

However, in the internal electrode layers 102 and 103, the insulating regions 106, in which no electrode is formed, are provided for insulating the electrode layers from either of the side electrodes. The insulating regions 106 do not expand nor contract even when a voltage is applied between the internal electrode layers 102 and 103. On this account, first regions that expand and contract, and second regions that do not expand and contract exist within the piezoelectric material layers 101, and therefore, there is a problem that stress is concentrated between these regions and they are easy to break.

As a related technology, Japanese Patent Application Publication JP-A-60-128683 discloses a method of manufacturing a long-life multilayered piezoelectric actuator (the second page, FIG. 2). According to JP-A-60-128683, internal electrodes are formed on the entire surface of green sheets mainly composed of a piezoelectric ceramic material, the green sheets are stacked in layers and sintered, machining is performed on both side surfaces of the sintered material, ends of the both side surfaces are insulated with a resin every other layer, and conducting layers are formed on the respective surfaces over the processed material. Thereby, durability can be improved compared to the conventional ones in which electrodes can not be formed all over the surfaces, and further, microfabrication can be performed because alignment is not required for forming internal electrodes partially.

However, the epoxy resin used for insulating the side surfaces of the element has a low withstand voltage, and therefore, the thickness of the resin must be made larger. For example, when the voltage for driving the piezoelectric element is 200V to 300V, the resin is required to have a thickness of 20 μm to 30 μm. In the case where the thickness of the resin is large, a problem occurs when an ultrasonic probe is manufactured by arranging plural piezoelectric elements in a one-dimensional or two-dimensional array form. That is, a filling material is poured between the plural piezoelectric elements when the ultrasonic probe is manufactured. However, in the case where gaps between the plural piezoelectric elements arranged are as small as 50 μm, it becomes difficult to pour the filling material into these piezoelectric elements due to the thickness of the resin.

SUMMARY OF THE INVENTION

The present invention is achieved in view of the above-mentioned problems. An object of the present invention is to easily manufacture an array of piezoelectric elements having multilayered structures by making insulating portions on side surfaces small.

In order to solve the above described problems, a piezoelectric element according to the present invention comprises: a multilayered structure in which a plurality of piezoelectric material layers and a plurality of internal electrode layers are alternately stacked, the plurality of internal electrode layers including a first group of internal electrode layers and a second group of internal electrode layers; first insulating films formed by using an aerosol deposition method, for covering the first group of internal electrode layers at a first surface of the multilayered structure; second insulating films formed by using the aerosol deposition method, for covering the second group of internal electrode layers at a second surface of the multilayered structure; a first external electrode electrically connected to the second group of internal electrode layers and insulated from the first group of internal electrode layers by the first insulating films at the first surface of the multilayered structure; and a second external electrode electrically connected to the first group of internal electrode layers and insulated from the second group of internal electrode layers by the second insulating films at the second surface of the multilayered structure.

Further, a method of manufacturing a piezoelectric element having a multilayered structure according to the present invention comprises the steps of: (a) fabricating a multilayered structure in which a plurality of piezoelectric material layers and a plurality of internal electrode layers are alternately stacked, the plurality of internal electrode layers including a first group of internal electrode layers and a second group of internal electrode layers; (b) forming first insulating films for covering the first group of internal electrode layers at a first surface of the multilayered structure by using an aerosol deposition method; (c) forming second insulating films for covering the second group of internal electrode layers at a second surface of the multilayered structure by using the aerosol deposition method; (d) forming a first external electrode electrically connected to the second group of internal electrode layers and insulated from the first group of internal electrode layers by the first insulating films at the first surface of the multilayered structure; and (e) forming a second external electrode electrically connected to the first group of internal electrode layers and insulated from the second group of internal electrode layers by the second insulating films at the second surface of the multilayered structure.

According to the present invention, the insulating portions on the side surfaces can be made small by forming the first insulating films for covering the first group of internal electrode layers at the first side surface of the multilayered structure and second insulating films for covering the second group of internal electrode layers at the second side surface of the multilayered structure by using the aerosol deposition method. As a result, an array of piezoelectric elements having multilayered structures can be easily manufactured.

BRIEF DESCRIPTION OF THE DRAWINGS

FIG. 2 is a flowchart showing a method of manufacturing the piezoelectric element according to one embodiment of the present invention;

DESCRIPTION OF THE PREFERRED EMBODIMENTS

Figure 1:
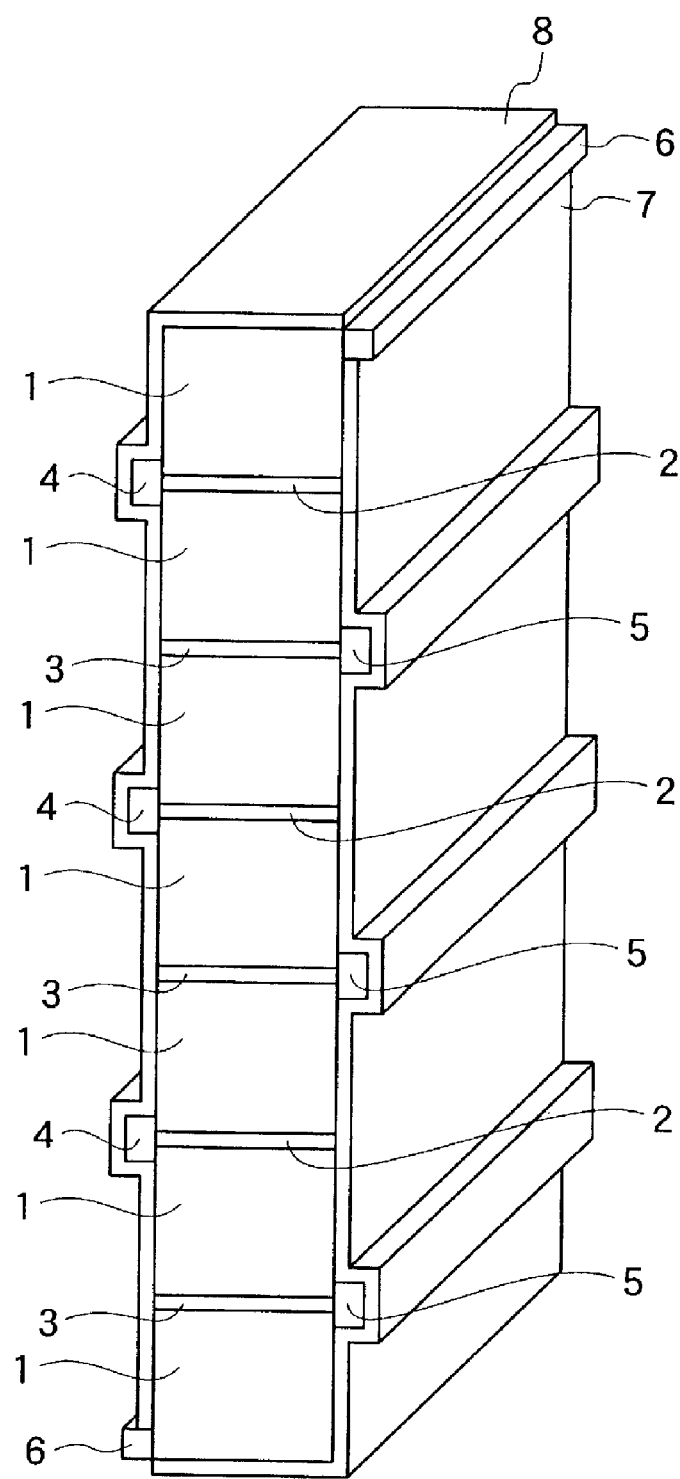
FIG. 1 is a perspective view showing a structure of a piezoelectric element according to one embodiment of the present invention.

Hereinafter, embodiments of the present invention will be described in detail by referring to the drawings. The same reference numerals are assigned to the same component elements and the description thereof will be omitted.

FIG. 1 shows a structure of a piezoelectric element according to one embodiment of the present invention. A piezoelectric element 10 as shown in FIG. 1 is a micro columnar structure having a bottom surface with sides having a length of about 0.3 mm to about 1.0 mm, and a height of about 2.1 mm. The piezoelectric element 10 includes plural PZT (Pb (lead) zirconate titanate) layers 1, plural first internal electrode layers 2, plural second internal electrode layers 3, plural first insulating films 4, plural second insulating films 5, plural third insulating films 6, a first external electrode 7, and a second external electrode 8.

In the embodiment, the PZT layers 1 are formed by the green sheet method. By the way, the PZT layers 1 may be formed by using the aerosol deposition (AD) method as a film forming method. The internal electrode layers 2 and the internal electrode layers 3 are alternately disposed between the plural PZT layers 1. The external electrode 7 covers one side surface and a bottom surface of the piezoelectric element 10, the external electrode 8 covers the other side surface and a top surface of the piezoelectric element 10, and the external electrodes 7 and 8 are insulated by the insulating films 6.

The internal electrode layers 2 are electrically connected to the external electrode 7 at the one side surface and insulated from the external electrode 8 by the insulating films 4 located on the other side surface. The internal electrode layers 3 are insulated from the external electrode 7 by the insulating films 5 located on the one side surface and electrically connected to the external electrode 8 at the other side surface. These plural insulating films 4 and 5 and plural insulating films 6 are formed by using the AD method as a film forming method.

By applying voltages between the internal electrode layers 2 and the internal electrode layers 3 via the external electrodes 7 and 8, the PZT layers 1 expand and contract by the piezoelectric effect. Such a piezoelectric element is used for piezoelectric pumps, piezoelectric actuators, ultrasonic transducers for transmitting and receiving ultrasonic waves in an ultrasonic probe, and so on. Further, in the piezoelectric element having the multilayered structure as shown in FIG. 1, areas of the opposed electrodes are larger than that in a single layer piezoelectric element, and thereby, electric impedance can be made lower. Therefore, compared to the single layer piezoelectric element, the piezoelectric element having the multilayered structure operates more efficiently for the applied voltage.

Next, a method of manufacturing the piezoelectric element according to the embodiment will be described by referring to FIGS. 2 to 5B. FIG. 2 is a flowchart showing the method of manufacturing the piezoelectric element according to the embodiment. Further, FIGS. 3A to 5B are diagrams for explanation of the method of manufacturing the piezoelectric element according to the embodiment.

Figure 3A:
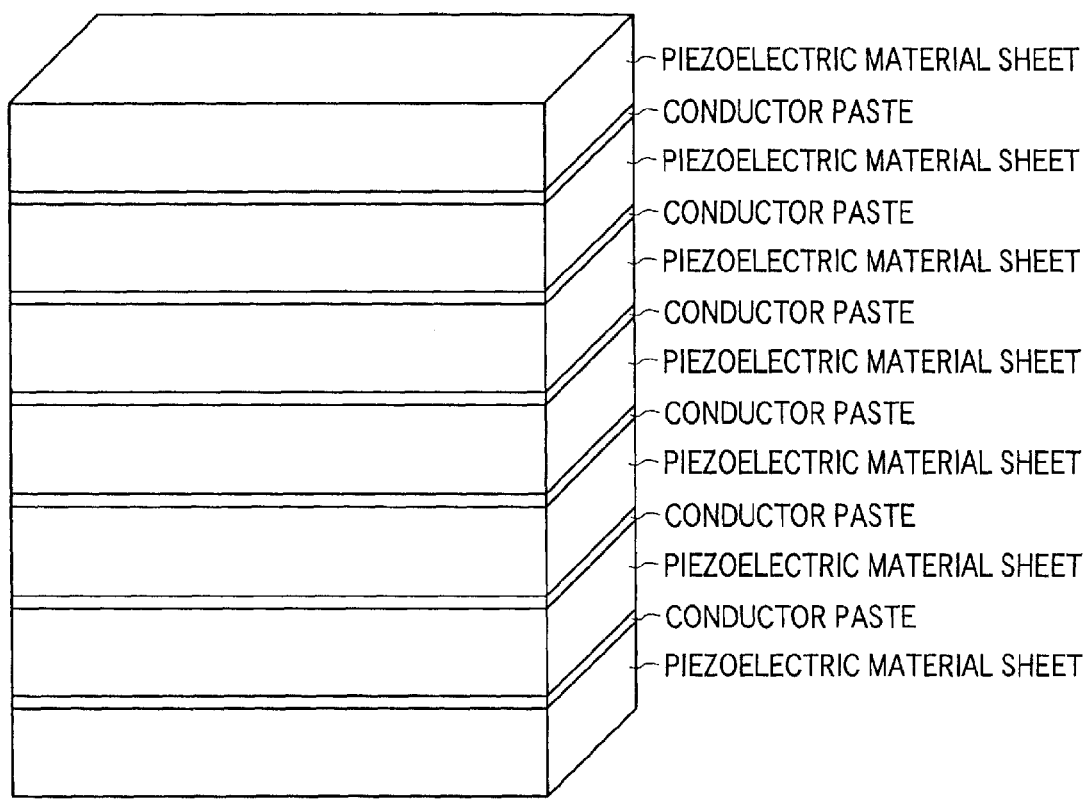
FIGS. 3A and 3B are diagrams for explanation of steps of forming PZT layers and internal electrode layers in the method of manufacturing the piezoelectric element as shown in FIG. 2.

First, at steps S1 to S3 as shown in FIG. 2, a multilayered structure including the PZT layers 1, the internal electrode layers 2 and the internal electrode layers 3 is formed. At step S1, as shown in FIG. 3A, plural sheets formed by arranging conductor paste on the piezoelectric material sheets (green sheet) are stacked. The piezoelectric material sheet is formed by a mixture of a powder of a piezoelectric material having no plasticity with a binder of an organic material or the like and a solvent. Further, the conductor paste is a paste of electrode material obtained by mixing a metal powder with a binder of an organic material or the like and a solvent, and applied onto the piezoelectric material sheet by screen printing or the like.

At step S2, the stacked plural sheets are applied with heat and pressure to be pressure bonded, and then the piezoelectric material and the electrode material are simultaneously baked. Thereby, the binders contained in the green sheets and conductor paste fly so that a multilayered structure is formed in which the PZT layers and the internal electrode layers are integrated. At the time of baking, the organic components and moisture are removed from the piezoelectric material sheets and the paste of the electrode material, and thereby, the volumes of the piezoelectric material sheets and the electrodes are reduced.

Figure 3B:
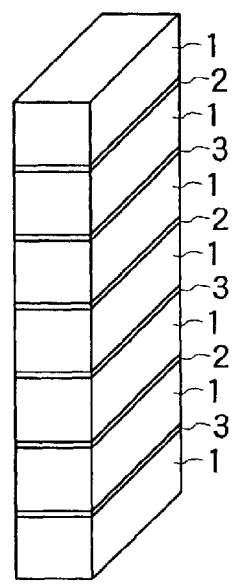

At step S3, the multilayered structure formed at step S2 is cut into desired sizes. Thereby, as shown in FIG. 3B, a multilayered structure 11 including the PZT layers 1, the internal electrode layers 2 and the internal electrode layers 3 and having a desired size is formed.

Figure 4A:
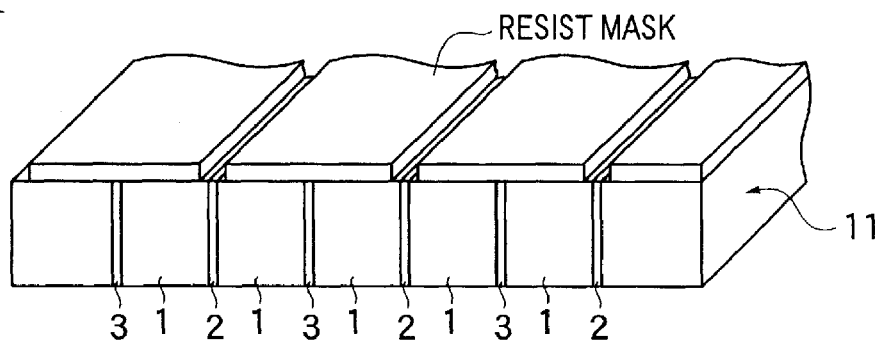
FIGS. 4A to 4D are diagrams for explanation of steps of forming insulating films in the method of manufacturing the piezoelectric element as shown in FIG. 2.
Figure 4B:
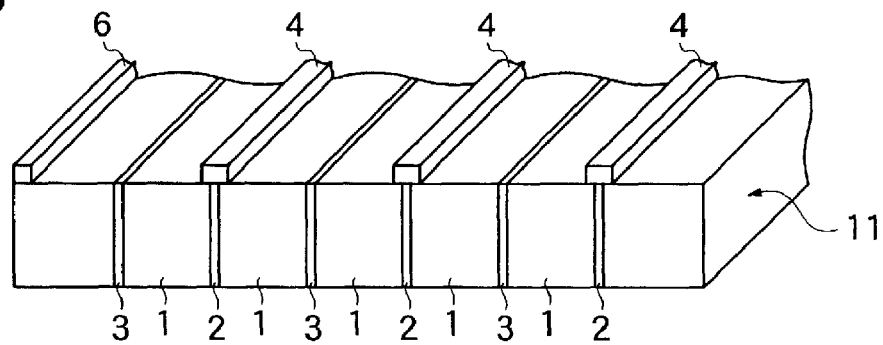

Then, at steps S4 to S7, the insulating films 4 to 6 are formed on the multilayered structure 11. At step S4, as shown in FIG. 4A, a resist mask having a desired pattern is formed on a first surface of the multilayered structure 11 by using the photolithography process. By the way, in place of the resist mask, a metal mask may be formed. At step S5, as shown in FIG. 4B, the insulating films 4 and the insulating films 6 are formed on the first surface of the multilayered structure 11 by using the resist mask, and then, the resist mask is removed.

Figure 4C:
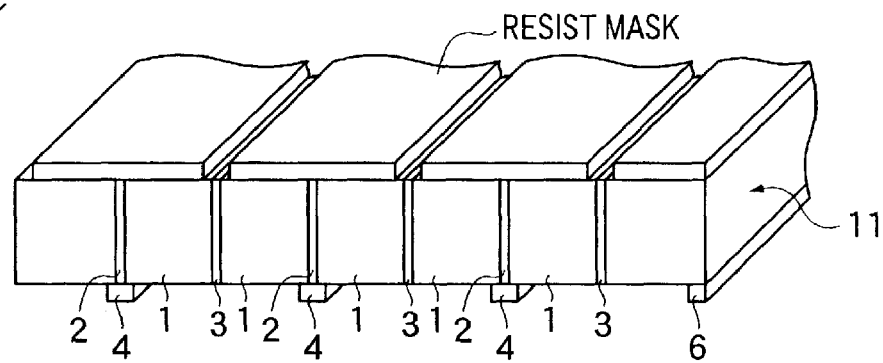
Figure 4D:
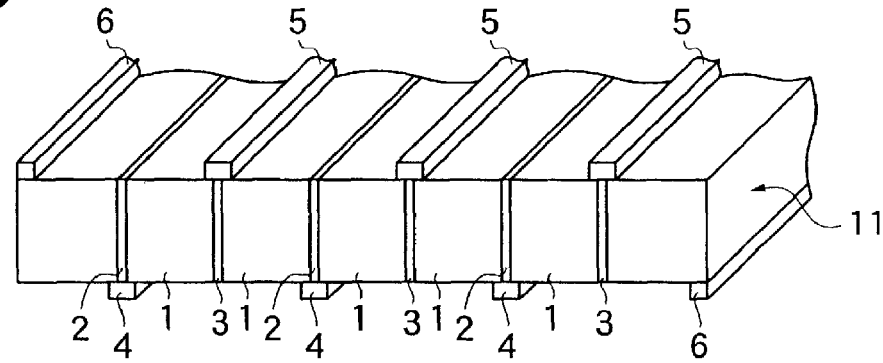

At step S6, the multilayered structure 11 is turned upside down, and, as shown in FIG. 4C, a resist mask having a desired pattern is formed on a second surface opposite to the first surface of the multilayered structure 11 by using the photolithography process. At step S7, as shown in FIG. 4D, the insulating films 5 and the insulating films 6 are formed on the second surface of the multilayered structure 11 by using the resist mask, and then, the resist mask is removed.

When the insulating films 4 to 6 are formed at these steps S5 and S7, the AD method is used as a film forming method, which will be described later. As a material of the insulating films 4 to 6, for example, PZT, alumina, zirconic (Zr) oxide such as zirconia ($ZrO_2$), titanium oxide ($TiO_2$), or the like can be used. That is, any material may be used that can form an insulating film by using the AD method as the film forming method.

Figure 5A:
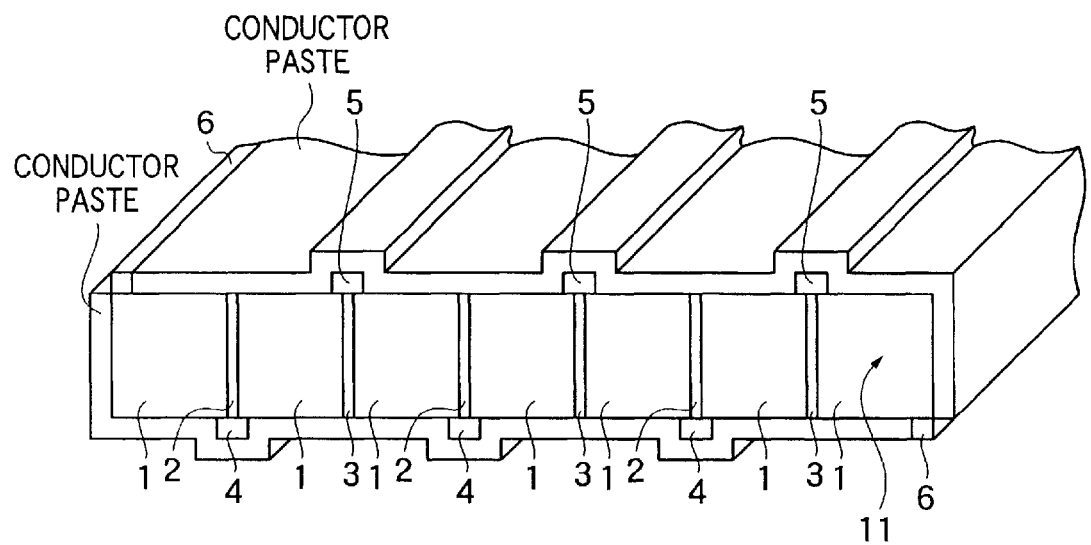
FIGS. 5A and 5B are diagrams for explanation of steps of forming external electrodes in the method of manufacturing the piezoelectric element as shown in FIG. 2.
Figure 5B:
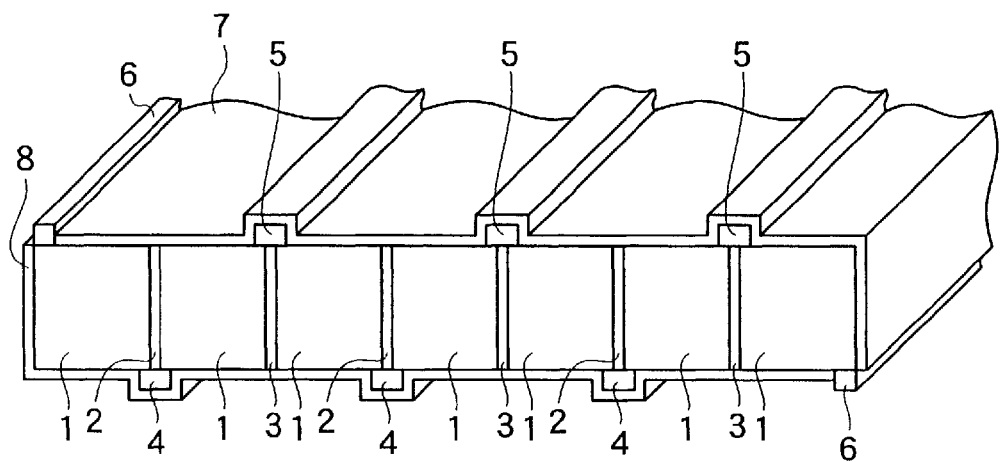

Then, at steps S8 and S9, the external electrodes 7 and 8 are formed. At step S8, as shown in FIG. 5A, conductor paste such as silver paste or palladium silver paste is applied to the portions except for the front surface and rear surface of the multilayered structure 11 and the insulating films 6. Then, at step S9, drying and baking of the conductor paste is performed. Thereby, as shown in FIG. 5B, the external electrodes 7 and 8 are formed. At the time of baking, the organic components and moisture are removed from the conductor paste, and thereby, the volume of the conductor paste is reduced.

Figure 6:
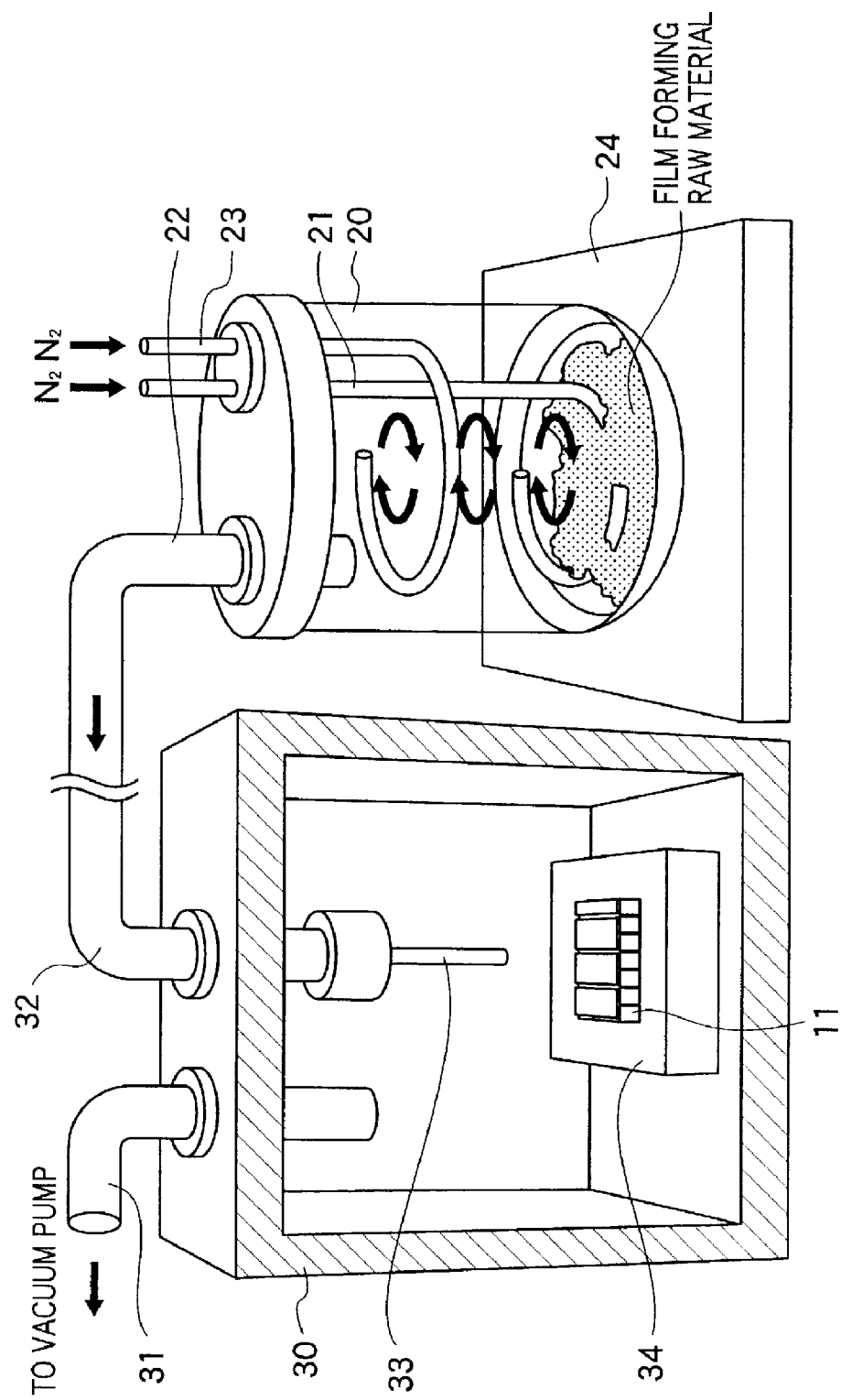
FIG. 6 shows a device to be used for forming films in accordance with the AD method.

Here, the AD method used for forming the insulating films in the embodiment will be described. FIG. 6 shows a device to be used for forming films in accordance with the AD method. This device has an aerosol generating container 20 and a film forming chamber 30. An aerosol refers to fine particles of a solid or liquid floating in a gas. In the embodiment, PZT fine particles having an average particle diameter of 0.2 μm to 1 μm are used for forming the insulating films.

The aerosol generating container 20 is a container in which a powder of the film forming raw material is located and the aerosol is generated. In the aerosol generating container 20, a carrier gas lead-in part 21, an aerosol lead-out part 22, and a pressure regulating nozzle 23 are provided. The carrier gas lead-in part 21 introduces a carrier gas as a gas to be used for carrying the raw material powder into the aerosol generating container 20. That is, the raw material powder located in the aerosol generating container 20 is blown up by the carrier gas so as to generate the aerosol.

As the carrier gas, dry air, nitrogen gas, argon gas, oxygen gas, helium gas, or the like is used. Further, the aerosol lead-out part 22 draws the aerosol generated in the aerosol generating container 20 and guides it to the film forming chamber 30. The pressure regulating nozzle 33 is used when the pressure difference between the aerosol generating container 20 and the film forming chamber 30 is adjusted.

Such an aerosol generating container 20 is mounted on a vibrating base 24. The vibrating base 24 provides vibration to the aerosol generating container 20 to agitate the raw material powder located inside thereof, and thereby, increases the generation efficiency of the aerosol.

In the film forming chamber 30, an exhaust pipe 31, an aerosol lead-in part 32, a nozzle 33 and a movable stage 34 are provided. The exhaust pipe 31 is connected to a vacuum pump and exhausts air from inside of the film forming chamber 30. The aerosol lead-in part 32 is connected to the aerosol lead-out part 22 of the aerosol generating container 20 and introduces the aerosol generated in the aerosol generating container 20 into the film forming chamber 30. The nozzle 33 sprays the aerosol introduced via the aerosol lead-in part 32 toward the multilayered structure 11 placed on the movable stage 34.

In the embodiment, the insulating films 4 to 6 are formed by using the AD method. According to the AD method, the material powders of the insulating films 4 to 6 are sprayed on a foundation layer such as the PZT layers 1 and the internal electrode layers 2 and 3 at a high speed and impinged thereon to form films, and thereby, so-called "anchoring" phenomenon occurs in which the material powders cut into the foundation layers. As a result, an anchor layer (a layer into which the material powders cut) is formed on each of the PZT layers 1 and the internal electrode layers 2 and 3 as the foundation layers.

The depth of the anchor layer is different depending on the quality of material of the foundation layer and the powder speed, and normally, on the order from 10 nm to 100 nm. Therefore, by observing the interfaces of the respective layers contained in the piezoelectric element 10, it can be discriminated that the method of manufacturing the piezoelectric element according to the present invention has been used.

According to the embodiment, an insulating film having a high withstand voltage can be formed by using the AD method, and thus, the insulating film can be made thinner. For example, when the voltage for driving the piezoelectric element is 200V to 300V, the insulating film can be made to have a small thickness of 2 μm to 3 μm. Further, since the insulating film formed by using the AD method is denser and stronger than the insulting film formed by an epoxy resin or the like, the mechanical strength can be improved. Furthermore, since the internal electrode layers 2 and the internal electrode layers 3 are located on the entire area of a surface of each PZT layer 1, stress is not concentrated on a partial region of the PZT layer 1. As a result, the durability of the piezoelectric element can be made better compared to that of the conventional piezoelectric element. By the way, in the embodiment, the external electrodes 7 and 8 are formed by employing the conductor paste. However, the external electrodes 7 and 8 may be formed by sputtering platinum. In this case, titanium (Ti) is desirably used as an adhesion layer.

By employing the piezoelectric elements according to one embodiment of the present invention described above, a piezoelectric element array can be fabricated. For example, a piezoelectric element array as shown in FIG. 7 is fabricated by arranging the plural piezoelectric elements 10 in a two-dimensional array form.

Figure 7:
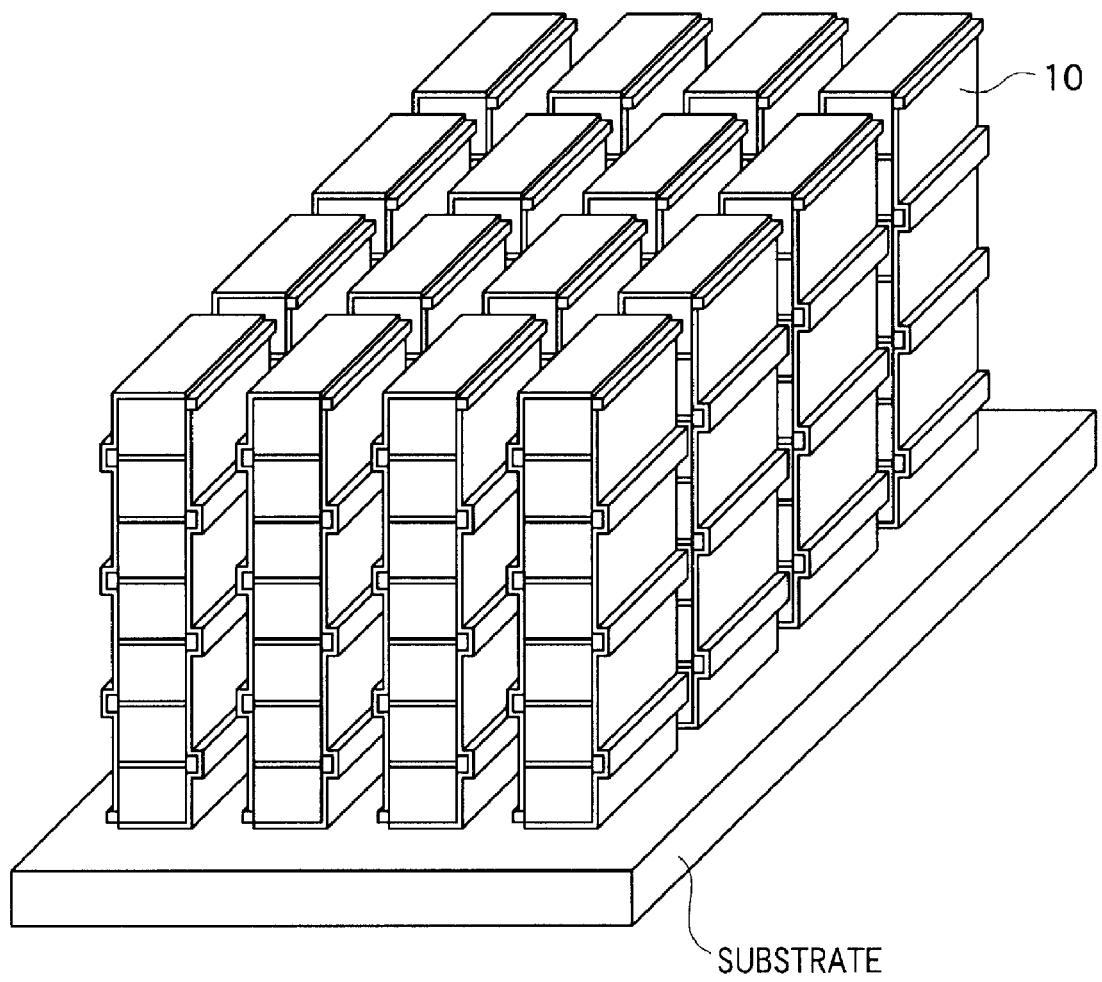
FIG. 7 is a perspective view showing a piezoelectric element array including the piezoelectric element as shown in FIG. 1.
Figure 8:
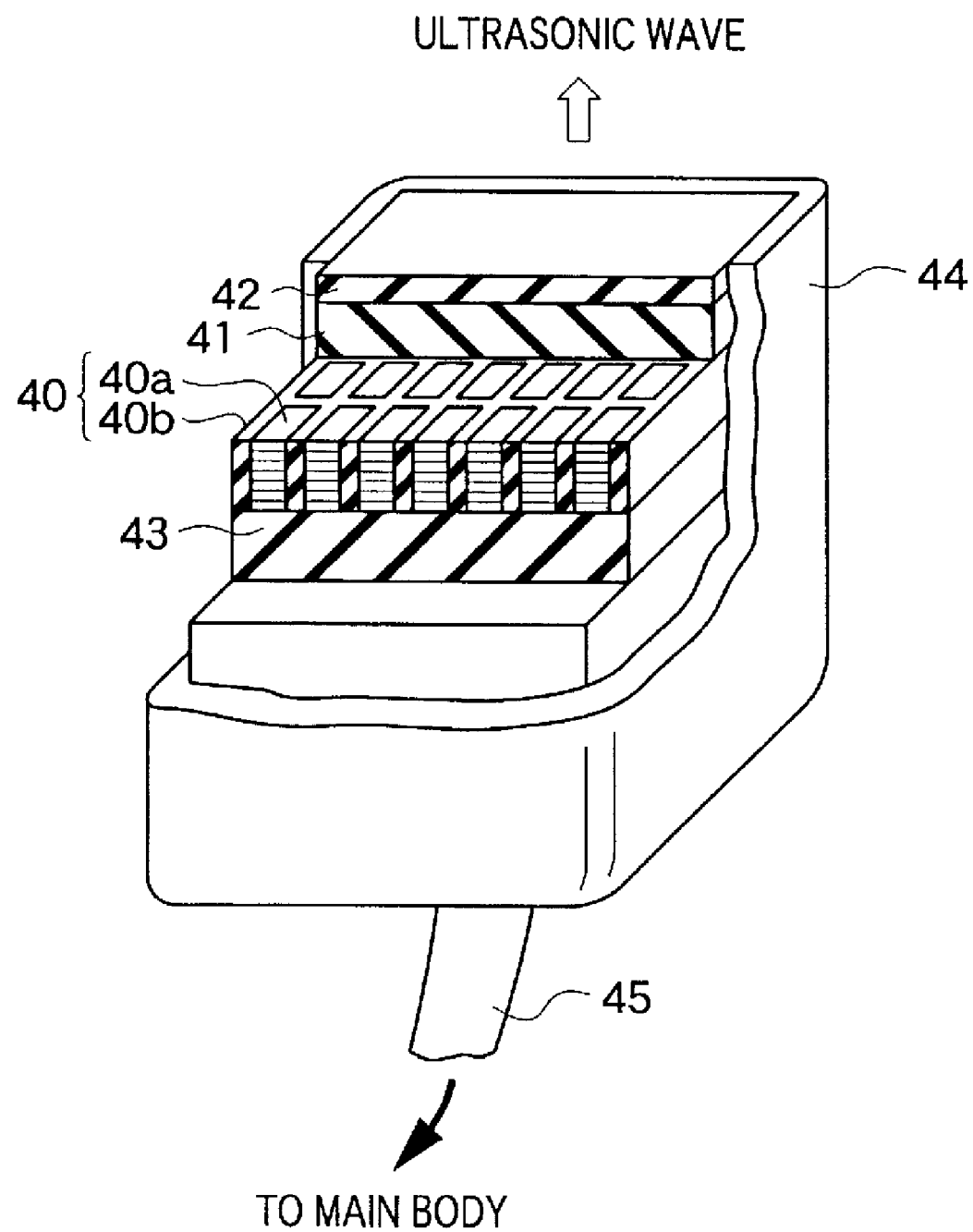
FIG. 8 is a partially sectional perspective view showing an example in which the piezoelectric element array as shown in FIG. 7 is applied to an ultrasonic probe.
Figure 9:
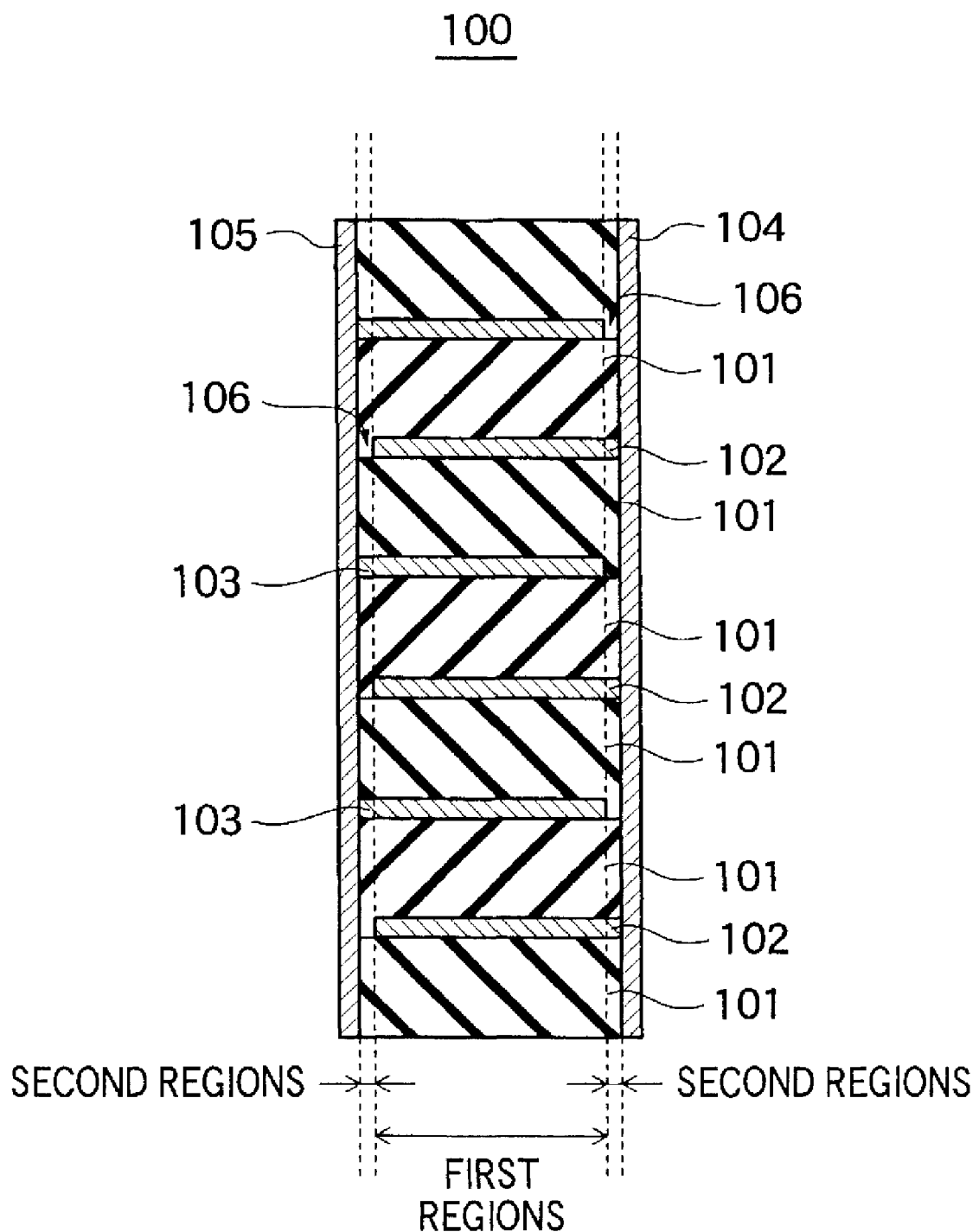
FIG. 9 is a sectional view for explanation of a general interconnecting method of a piezoelectric element having a multilayered structure.

FIG. 8 is a partial sectional perspective view showing an example in which the piezoelectric element array as shown in FIG. 7 is applied to an ultrasonic probe. This ultrasonic probe includes an ultrasonic transducer array 40 having plural ultrasonic transducers for transmitting and receiving ultrasonic waves, an acoustic matching layer 41, an acoustic lens 42, and a backing layer 43. These parts 40 to 43 are accommodated in a casing 44. Further, interconnections drawn from the plural ultrasonic transducers of the ultrasonic transducer array 40 are connected via a cable 45 to an ultrasonic imaging apparatus main body.

The ultrasonic transducer array 40 includes plural ultrasonic transducers 40*a* arranged in a two-dimensional matrix form and filling materials 40*b* such as an epoxy resin located between those ultrasonic transducers 40*a*.

The acoustic matching layer 41 is formed by glass, ceramic, epoxy resin mixed with metal powder, or the like that can easily transmit ultrasonic waves, and provided for eliminating a mismatch of the acoustic impedance between an object to be inspected such as a living body and the ultrasonic transducer. Thereby, the ultrasonic wave transmitted from the ultrasonic transducer propagates efficiently within the object.

The acoustic lens 42 is formed by silicon rubber, for example, and provided for focusing an ultrasonic beam, which has been transmitted from the ultrasonic transducer array 40 and passed the acoustic matching layer 41, at a predetermined depth.

The backing layer 43 is formed by a material providing large acoustic attenuation such as epoxy resin or rubber mixed with powder of a metal, ferrite or PZT, and provided for rapidly attenuating unwanted ultrasonic wave generated by the ultrasonic transducer array 40.

Such an ultrasonic probe is fabricated in the following manner, for example. A common electrode is formed on a substrate such as ceramic such as Macor (registered trademark) or glass that can be used as the acoustic matching layer, and the plural piezoelectric elements 10 are arranged thereon in a two-dimensional array form as shown in FIG. 7. Then, filling materials are located between those piezoelectric elements 10. Thereby, the ultrasonic transducer array 40 and the acoustic matching layer 41 are fabricated. By the way, the acoustic matching layer having plural layers may be provided by further bonding another acoustic matching layer to the substrate. Furthermore, separate interconnections are drawn from the respective ultrasonic transducers (piezoelectric elements 10), the backing layer 43 is located, and the acoustic lens 42 is located at the acoustic matching layer 41 side.

In the case where the piezoelectric element according to the embodiment is applied to the ultrasonic probe, the withstand voltage of the insulating films can be made higher by forming the insulating films by using the AD method, and even when the voltage for driving the ultrasonic transducer is 200V to 300V, the insulating film can be made to have a small thickness of 2 μm to 3 μm. Therefore, interferences between the plural ultrasonic transducers can be suppressed. Further, when a gap length between the plural ultrasonic transducers is on the order of 50 μm, the insulating portions on the side surfaces never cause a barrier when the filing material such as an epoxy resin is poured between the ultrasonic transducers.

Thereby, a large number of ultrasonic transducers can be packaged densely, and therefore, an ultrasonic probe can be obtained that is capable of obtaining an ultrasonic image with high resolving power. Further, an ultrasonic probe including the two-dimensional ultrasonic transducer array, to which the piezoelectric elements according to the present invention are applied, can be utilized in an ultrasonic diagnostic apparatus for acquiring three-dimensional ultrasonic images in real time because the plural ultrasonic transducers are packaged densely.

The invention claimed is:

1. A method of manufacturing a piezoelectric element having a multilayered structure, said method comprising the steps of:
   (a) fabricating a multilayered structure in which a plurality of piezoelectric material layers and a plurality of internal electrode layers are alternately stacked, said plurality of internal electrode layers including a first group of internal electrode layers and a second group of internal electrode layers;
   (b) forming a mask on at least regions of a first surface of said multilayered structure except for end portions of said first group of internal electrode layers;
   (c) forming first insulating films for covering the end portions of said first group of internal electrode layers at the first surface of said multilayered structure, on which the mask has been formed at step (b), by using an aerosol deposition method;
   (d) removing the mask formed at step (b);
   (e) forming a mask on at least regions of a second surface opposite to the first surface of said multilayered structure except for end portions of said second group of internal electrode layers;
   (f) forming second insulating films for covering the end portions of said second group of internal electrode layers at the second surface of said multilayered structure, on which the mask has been formed at step (e), by using the aerosol deposition method;

(g) removing the mask formed at step (e);

(h) forming, after step (d), a first external electrode electrically connected to said second group of internal electrode layers and insulated from said first group of internal electrode layers by said first insulating films at the first surface of said multilayered structure; and (i) forming, after step (g), a second external electrode electrically connected to said first group of internal electrode layers and insulated from said second group of internal electrode layers by said second insulating films at the second surface of said multilayered structure.

2. The method of manufacturing a piezoelectric element according to claim 1, wherein said first group of internal electrode layers and said second group of internal electrode layers are alternately disposed.

3. The method of manufacturing a piezoelectric element according to claim 1, wherein step (a) includes stacking plural sheets, each including a sheet of a piezoelectric material mixed with a binder and a solvent and at least an electrode material formed thereon, and baking the stacked plural sheets.

4. The method of manufacturing a piezoelectric element according to claim 1, wherein step (a) includes forming said plurality of piezoelectric material layers by using the aerosol deposition method.

5. The method of manufacturing a piezoelectric element according to claim 1, wherein the mask formed at least one of step (b) and (e) includes one of a resist mask and a metal mask.

* * * * *